United States Patent [19]

Negoro

[11] Patent Number: 5,411,921
[45] Date of Patent: May 2, 1995

[54] SEMICONDUCTOR CHIP DIE BONDING USING A DOUBLE-SIDED ADHESIVE TAPE

[75] Inventor: Atsuhito Negoro, Kyoto, Japan

[73] Assignee: Rohm Co., Ltd., Kyoto, Japan

[21] Appl. No.: 218,764

[22] Filed: Mar. 28, 1994

Related U.S. Application Data

[62] Division of Ser. No. 13,754, Feb. 4, 1993.

[30] Foreign Application Priority Data

Feb. 10, 1992 [JP] Japan .................................. 4-023731

[51] Int. Cl.⁶ .............................................. H01L 21/60
[52] U.S. Cl. .................................. 437/217; 437/209; 437/215; 437/219; 437/220
[58] Field of Search ............... 437/209, 211, 212, 213, 437/214, 215, 216, 217, 218, 219, 220; 156/247, 248, 249, 250; 148/DIG. 28

[56] References Cited

U.S. PATENT DOCUMENTS

| | | | |
|---|---|---|---|
| 3,887,996 | 6/1975 | Hartleroad et al. | 437/209 |
| 4,590,667 | 5/1986 | Simon | 148/DIG. 28 |
| 4,667,402 | 5/1987 | Wilde | 437/224 |
| 5,110,388 | 5/1952 | Komiyama et al. | 156/249 |
| 5,270,260 | 12/1993 | Scheunenpflug | 437/212 |

*Primary Examiner*—Brian E. Hearn
*Assistant Examiner*—Kevin M. Picardat
*Attorney, Agent, or Firm*—Brumbaugh, Graves, Donohue & Raymond

[57] ABSTRACT

A semiconductor wafer is stuck on an expandable tape via a double-sided adhesive tape, and the semiconductor wafer is diced into semiconductor chips such that the double-sided adhesive tape is also cut into tape sections. Then, the expandable tape is expanded to deform plastically to thereby part the semiconductor chips from each other. Then, the semiconductor chip and the tape section stuck thereto is removed from the expandable tape, in which the semiconductor chip is pushed by a bar having a pointed tip while the expandable tape is vacuum-sucked. Finally, the semiconductor chip is bonded to a die pad of a lead frame via the tape section stuck to the semiconductor chip.

5 Claims, 2 Drawing Sheets

SEMICONDUCTOR CHIP DIE BONDING USING A DOUBLE-SIDED ADHESIVE TAPE

This application is a division of application Ser. No. 08/013,754, filed on Feb. 4, 1993.

BACKGROUND OF THE INVENTION

The present invention relates to an improvement of bonding of a semiconductor chip to a die pad of a lead frame.

Conventionally, a semiconductor device is produced by first bonding a semiconductor chip to a die pad of a lead frame (what is called the die bonding), performing electrical connections such as wire bonding to the respective leads, and finally sealing this structure by forming a resin (hereinafter called molding). As shown in FIG. 6, in the die bonding of a semiconductor chip 4, a preform material 10 that is a bonding material such as Au, Au—Si, a solder or a paste is applied to a die pad 8 of a lead frame that is a metal thin plate made of, e.g., a 42—Ni alloy.

Where the preform material 10 is a metallic material, it needs to be heated to a high temperature in the bonding process. For example, in the case of the Au—Si preform material, the die pad 8 is pre-heated at about 300° C. for several seconds, further heated to 500°–600° C. at the time of the bonding, and then gradually cooled.

In the case of metallic preform materials, such as Au, Au—Si and a solder, which need to be heated to a high temperature in the bonding process, a thermal stress is exerted on the semiconductor chip to affect the semiconductor characteristics. Further, several heating stages, for instance, stages for pre-heating at 300° C., bonding at 500–600° C., gradual cooling at 300° C., 100° C. and 25° C. (ordinary temperature), should be prepared, which causes an increase of costs of manufacturing equipment.

Since the paste preform material is made, for instance, of an epoxy resin that is made conductive by adding a silver powder etc., the bonding process itself can be performed at the ordinary temperature. However, to set the resin, a large number of bonded structures are collected and subjected to aging in an oven at about 170° C. for 10–20 hours.

However, the existence of the aging step lowers the efficiency of the bonding process and causes a cost increase. Further, there exist some factors of deteriorating the semiconductor characteristics: for instance, the semiconductor device is placed in an environment of a relatively high temperature of about 170° C., and a volatile organic gas generated from the paste may corrode the solder.

In addition, since MOS semiconductor devices need very little current, it is becoming less important to dissipate heat through the semiconductor substrate and the die pad, and to make a current flow through the back face of the semiconductor substrate. That is, it is now desired that adverse influences on the semiconductor characteristics be prevented and the efficiency of the die bonding process be improved, rather than considering such properties as electrical conduction and thermal conduction of the die bonding material.

SUMMARY OF THE INVENTION

In view of the above circumstances, an object of the present invention is to provide a semiconductor device in which the die bonding can be performed easily without a heating process. Another object of the invention is to provide a manufacturing method of such a semiconductor device.

According to the invention, in a semiconductor device of a type in which a semiconductor chip is bonded to a die pad and the semiconductor chip and wires for electrical connection between the semiconductor chip and leads are molded by a resin, the semiconductor chip is bonded to the die pad via a double-sided adhesive tape.

According to a second aspect of the invention, a method of manufacturing a semiconductor device comprises the steps of:
sticking a semiconductor wafer on an expandable tape via a double-sided adhesive tape;
dicing the semiconductor wafer into semiconductor chips such that the double-sided adhesive tape is cut into tape sections together with the semiconductor wafer;
expanding the expandable tape to part the semiconductor chips from each other;
removing the semiconductor chip and the tape section stuck thereto from the expandable tape; and
bonding the semiconductor chip to a die pad of a lead frame via the tape section stuck to the semiconductor chip.

DESCRIPTION OF THE PREFERRED EMBODIMENT

A manufacturing method of a semiconductor device according to the present invention is described hereinafter with reference to the accompanying drawings. FIGS. 1–5 show respective steps of a die bonding process, which is the main process of the manufacturing method of the invention.

Figure 1:
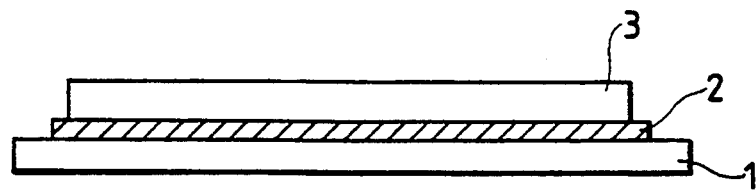
FIGS. 1–5 are views showing manufacturing steps of a semiconductor device according to an embodiment of the present invention.

First, as shown in FIG. 1, a double-sided adhesive tape 2 is stuck on the surface of an expandable tape 1 made of, e.g., a polyvinyl chloride film. Then, a semiconductor wafer 3 is stuck on the double-sided adhesive tape 2 such that the back surface of the former faces the latter. The double-sided adhesive tape 2 is formed, for instance, by applying an ordinary adhesive to a resin film such as a polyimide film, and should have a size larger than the semiconductor wafer 3.

Figure 2:
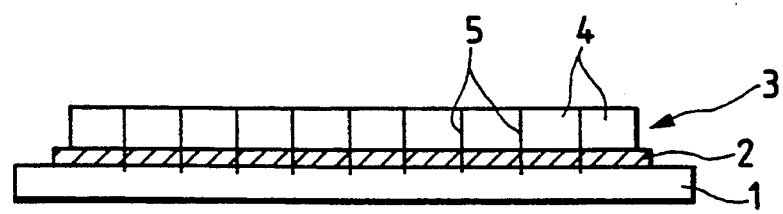

Then, as shown in FIG. 2, to divide the semiconductor wafer 3, which has on its front surface a large number of identical semiconductor circuits arranged in matrix, into semiconductor chips 4, cutting lines 5 are formed at the boundaries between the adjacent semiconductor circuits with a diamond cutter. The cutting lines 5 are formed so as to reach the expandable tape 1 through the semiconductor wafer 3 and the double-sided adhesive tape 2. Since the cutting lines 5 are formed in the expandable tape 1 only slightly, the respective semiconductor chips 4 thus cut remain to stick to the expandable tape 1 via the double-sided adhesive tape 2, so that the semiconductor chips do not part from each other in this step.

Figure 3:
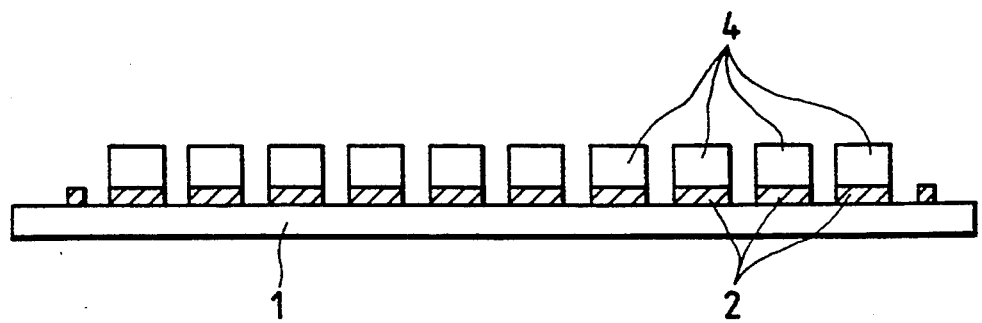

Then, the expandable tape 1 is expanded by attaching its outer frame (not shown) to a container and vacuum-sucking the tape 1 or applying pressure to it. As a result, the expandable tape 1 deforms plastically, and the semiconductor chips 4 are parted from each other as shown in FIG. 3.

Figure 4:
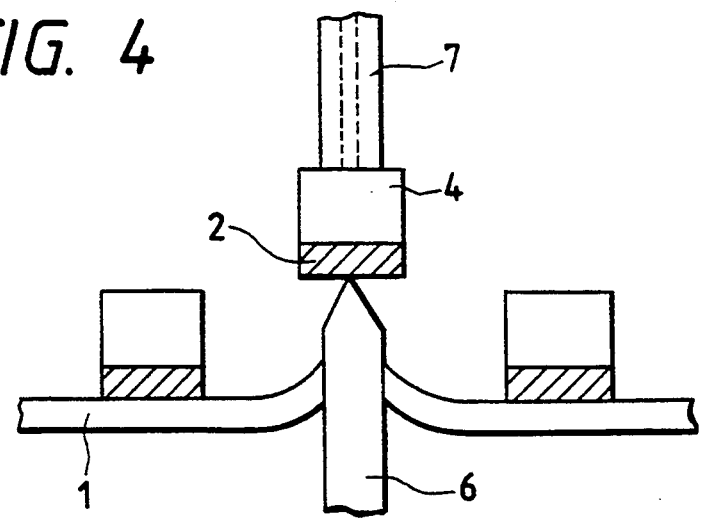
Figure 5:
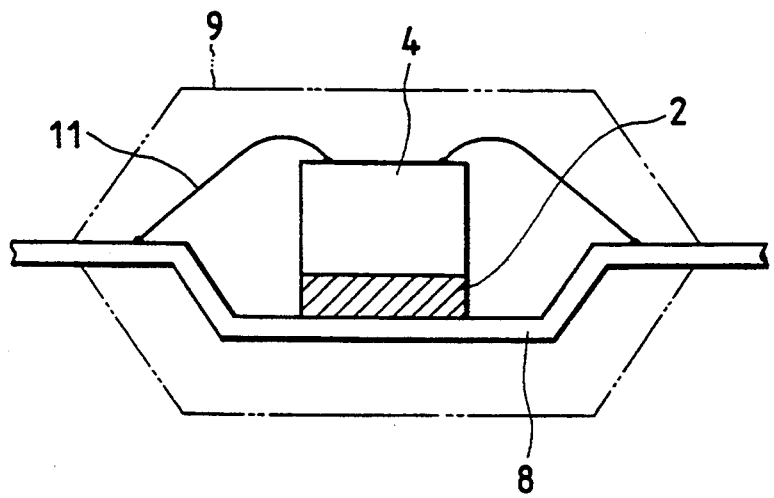
Figure 6:
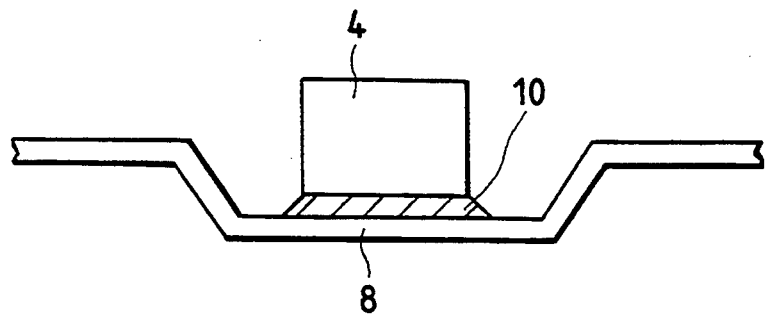
FIG. 6 is a view showing a conventional die bonding method.

In this state, the outer frame of the expandable tape 1 is again attached to the vacuum sucking device, and while the bottom surface of the expandable tape 1 is sucked, a semiconductor chip 4 to be picked up is pushed upward by a push-up bar 6 (see FIG. 4). At the same time, the front surface of the semiconductor chip 4 is vacuum-sucked upward through a collet 7. Since the bottom surface of the expandable tape 1 is vacuum-sucked, when the tape 1 is pushed upward by a pointed tip of the push-up bar 6, its portion around the pointed tip of the bar 6 is kept sucked to peel off from the double-sided adhesive tape 2 and goes down. As a result, the expandable tape 1 is stuck to the double-sided adhesive tape 2 only at its very small portion that is on the pointed tip of the push-up bar 6, or, exactly as shown in FIG. 4, the bar 6 breaks through the expandable tape 1 while lifting the semiconductor chip 4. Thus, when the semiconductor chip 4 is further lifted while being vacuum-sucked through the collet 7, the semiconductor chip 4 having the double-sided adhesive tape 2 is easily removed from the expandable tape 1. The semiconductor chip 4 as picked up is then carried to a die pad 8 of a lead frame by the collet 7, and can be bonded thereto simply by pushing (see FIG. 5).

It may be the case that when the semiconductor chip 4 is removed from the expandable tape 1, peeling occurs between the semiconductor chip 4 and the double-sided adhesive tape 2. This can be avoided, i.e., peeling occurs between the double-sided adhesive tape 2 and the expandable tape 1 in a positive manner where the push-up bar 6 breaks through the expandable tape 1 while lifting the semiconductor chip 4 as shown in FIG. 4. Even where the push-up bar 6 does not break through the expandable tape 1, the double-sided adhesive tape 1 that has been cut into a small section hardly continues to stick to the angle-bracket-like deformed portion of the expandable tape 1 (that is being sucked) around the push-up bar 6, to assure that the peeling occurs between the double-sided adhesive tape 2 and the expandable tape 1. The peeling occurrence at this location can be more assured by adjusting the adhesion of the surface of the double-sided adhesion tape 2 to be stuck to the expandable tape 1 to be stronger than the ether surface to be stuck to the semiconductor chip 4.

Subsequently, electrical connections, i.e., wire bonding between bonding pads on the semiconductor chip 4 and respective leads of the lead frame are made using, e.g., a gold wire 11 (alternatively, bumps may be used), and the resultant structure is molded by a resin 9. Finally, the lead frame is cut at connecting portions of the respective leads, and forming is performed. Thus, a semiconductor device is produced (see FIG. 5 ).

As described above, according to the invention, the double-sided adhesive tape is used to bond the semiconductor chip to the die pad of the lead frame. Therefore, neither heating to a high temperature nor aging over a long period is needed in the die bonding process. There occur no adverse influences, such as a thermal stress, on the semiconductor characteristics, and there are generated no volatile gasses harmful to the semiconductor chip. Thus, it becomes possible to produce semiconductor devices having high reliability and superior characteristics at a high yield. Further, since the semiconductor chip is completely secured to the die pad by the resin, no problems will occur with the passage of time with respect to the bonding characteristic of the semiconductor chip.

Further, according to the invention, the double-sided adhesive tape is easily stuck on the semiconductor wafer having a large size, and is cut at the same time as the wafer dicing. Therefore, the increase of the number of manufacturing steps that is caused by the addition of the double-sided adhesive tape is negligible. The number of the entire steps rather decreases very much because there are needed no heating, gradual cooling and aging in the die bonding process. In addition, since no equipment for heating is necessary, the manufacturing cost is reduced greatly.

What is claimed is:

1. A method of manufacturing a semiconductor device comprising the steps of:
   providing a double-sided adhesive tape having first and second adhesive surfaces on opposite side. S;
   applying a semiconductor wafer to an expandable tape using the double-sided adhesive tape by adhering the semiconductor wafer to the first adhesive surface and adhering the expandable tape to the second adhesive surface;
   dicing the semiconductor wafer into a plurality of semiconductor chips such that the double-sided adhesive tape is cut into tape sections together with the semiconductor wafer;
   expanding the expandable tape to part the semiconductor chips from each other;
   removing each of the plurality of semiconductor chips and the double-sided adhesive tape section adhered thereto from the expandable tape; and
   bonding each of the plurality of semiconductor chips to a die pad of a lead frame by adhering the second adhesive surface of the double-sided adhesive tape section adhered to the semiconductor chip to the die pad.

2. The method of claim 1, wherein in the expanding step the expandable tape is expanded to deform plastically.

3. The method of claim 1, wherein in the expanding step the expandable tape is expanded by vacuum-sucking it.

4. The method of claim 1, wherein the removing step comprises pushing the semiconductor chip to be removed from a first side opposite to the semiconductor chip by a bar having a pointed tip while sucking the expandable tape from the first side.

5. The method of claim 4, wherein in the removing step the semiconductor chip is pushed by the bar until the bar breaks through the expandable tape.

* * * * *

UNITED STATES PATENT AND TRADEMARK OFFICE
CERTIFICATE OF CORRECTION

PATENT NO. : 5,411,921

DATED : May 2, 1995

INVENTOR(S) : Atsuhito Negoro

It is certified that error appears in the above-indentified patent and that said Letters Patent is hereby corrected as shown below:

Column 3, line 47 "ether" should read --other--;

Column 4, line 26 "side. S;" should read --sides;--.

Signed and Sealed this

Twenty-second Day of August, 1995

Attest:

BRUCE LEHMAN

*Attesting Officer*     *Commissioner of Patents and Trademarks*